(12) United States Patent
Carbone et al.

(10) Patent No.: US 9,923,524 B2
(45) Date of Patent: Mar. 20, 2018

(54) DIGITAL PRE-DISTORTION FOR MULTI-ANTENNA SYSTEMS

(71) Applicant: QUALCOMM Incorporated, San Diego, CA (US)

(72) Inventors: Nicholas Michael Carbone, San Diego, CA (US); Jeremy Darren Dunworth, La Jolla, CA (US); Hyunchul Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/214,857

(22) Filed: Jul. 20, 2016

(65) Prior Publication Data

US 2018/0026586 A1    Jan. 25, 2018

(51) Int. Cl.
*H03F 1/32* (2006.01)
*H04B 17/00* (2015.01)
*H03F 3/21* (2006.01)
*H04W 52/52* (2009.01)

(52) U.S. Cl.
CPC ........... *H03F 1/3241* (2013.01); *H03F 3/211* (2013.01); *H04W 52/52* (2013.01); *H03F 2201/3212* (2013.01); *H03F 2203/21131* (2013.01)

(58) Field of Classification Search
CPC ..... H03F 3/68; H03F 1/02; H03F 1/32; H03F 1/3211; H03F 1/3241; H04B 17/00; H04B 17/10; H04B 17/11; H04B 17/13
See application file for complete search history.

(56) References Cited

U.S. PATENT DOCUMENTS

| | | |
|---|---|---|
| 5,438,684 A | 8/1995 | Schwent et al. |
| 8,749,307 B2 | 6/2014 | Zhu et al. |
| 8,964,821 B2 | 2/2015 | Coan et al. |
| 9,130,628 B1 | 9/2015 | Mittal et al. |
| 9,300,333 B2 | 3/2016 | Subrahmaniyan Radhakrishnan |
| 2009/0115530 A1* | 5/2009 | Bott ...................... H03F 1/0288 330/295 |

(Continued)

FOREIGN PATENT DOCUMENTS

WO    WO-0108294 A1    2/2001

OTHER PUBLICATIONS

International Search Report and Written Opinion—PCT/US2017/042824—ISA/EPO—dated Oct. 24, 2017.

*Primary Examiner* — Blane Jackson
(74) *Attorney, Agent, or Firm* — Patterson & Sheridan, L.L.P.

(57) ABSTRACT

Certain aspects of the present disclosure relate to methods and apparatus for power amplifier control. A power amplifier network includes a first path comprising a first power amplifier. The power amplifier network further includes a second path comprising a second power amplifier. The power amplifier network further includes a common input path to both the first path and the second path. The power amplifier network further includes a first power control network for controlling a first signal applied to the first power amplifier. The power amplifier network further includes a second power control network for controlling a second signal applied to the second power amplifier, wherein the first power control network is different from the second power control network.

21 Claims, 11 Drawing Sheets

(56) References Cited

U.S. PATENT DOCUMENTS

| | | | |
|---|---|---|---|
| 2011/0156815 A1* | 6/2011 | Kim | H03F 1/304 330/149 |
| 2012/0219048 A1* | 8/2012 | Camuffo | H03F 1/0255 375/224 |
| 2012/0313700 A1* | 12/2012 | Bai | H03F 1/3252 330/124 R |
| 2014/0184334 A1* | 7/2014 | Nobbe | H03F 1/0227 330/291 |
| 2016/0072457 A1* | 3/2016 | Subrahmaniyan Radhakrishnan | H03F 1/0211 375/219 |
| 2016/0072530 A1 | 3/2016 | El-Hassan et al. | |
| 2016/0241277 A1* | 8/2016 | Rexberg | H04B 1/0475 |
| 2017/0279470 A1* | 9/2017 | Lee | H04B 1/04 |

* cited by examiner

DIGITAL PRE-DISTORTION FOR MULTI-ANTENNA SYSTEMS

FIELD

Certain aspects of the present disclosure generally relate to wireless communications and, more particularly, to techniques for power amplifier control.

BACKGROUND

In order to address the issue of increasing bandwidth requirements that are demanded for wireless communications systems, different schemes are being developed to allow multiple user terminals to communicate with a single access point by sharing the channel resources while achieving high data throughputs. Multiple Input Multiple Output (MIMO) technology represents one such approach that has recently emerged as a popular technique for the next generation communication systems. MIMO technology has been adopted in several emerging wireless communications standards such as the Institute of Electrical and Electronics Engineers (IEEE) 802.11 standard. The IEEE 802.11 denotes a set of Wireless Local Area Network (WLAN) air interface standards developed by the IEEE 802.11 committee for short-range communications (e.g., tens of meters to a few hundred meters).

A MIMO wireless system employs a number ($N_T$) of transmit antennas and a number ($N_R$) of receive antennas for data transmission. A MIMO channel formed by the $N_T$ transmit and $N_R$ receive antennas may be decomposed into $N_S$ spatial streams, where, for all the practical purposes, $N_S <= \min\{N_T, NR\}$. The $N_S$ spatial streams may be used to transmit $N_S$ independent data streams to achieve greater overall throughput.

It may be desirable that devices in wireless communication systems send and receive large amounts of data within a given bandwidth. It may also desirable that these devices operate efficiently. One way to increase the device efficiency may be to use more efficient amplifiers within the device. However, these efficient amplifiers may introduce additional distortion to transmit signals and cause significant spectral re-growth.

One solution is to operate these amplifiers near the non-linear region and use a pre-distortion device at the input of the amplifier to counteract the distortion introduced to transmit signals by the amplifier.

SUMMARY

Certain aspects of the present disclosure provide a power amplifier network that includes a first path comprising a first power amplifier. The power amplifier network further includes a second path comprising a second power amplifier. The power amplifier network further includes a common input path to both the first path and the second path. The power amplifier network further includes a first power control network for controlling a first signal applied to the first power amplifier. The power amplifier network further includes a second power control network for controlling a second signal applied to the second power amplifier, wherein the first power control network is different from the second power control network.

Certain aspects of the present disclosure provide a method for controlling a plurality of power amplifiers. The method comprises supplying a common input signal along a common input path. The method further comprises splitting the common input signal among a first path comprising a first power amplifier and a second path comprising a second power amplifier. The method further comprises processing the common input signal to generate a first input signal to the first power amplifier. The method further comprises processing the common input signal to generate a second input signal to the second power amplifier. The method further comprises selecting a first signal to apply to the first power amplifier. The method further comprises selecting a second signal to apply to the second power amplifier.

DETAILED DESCRIPTION

Figure 1:
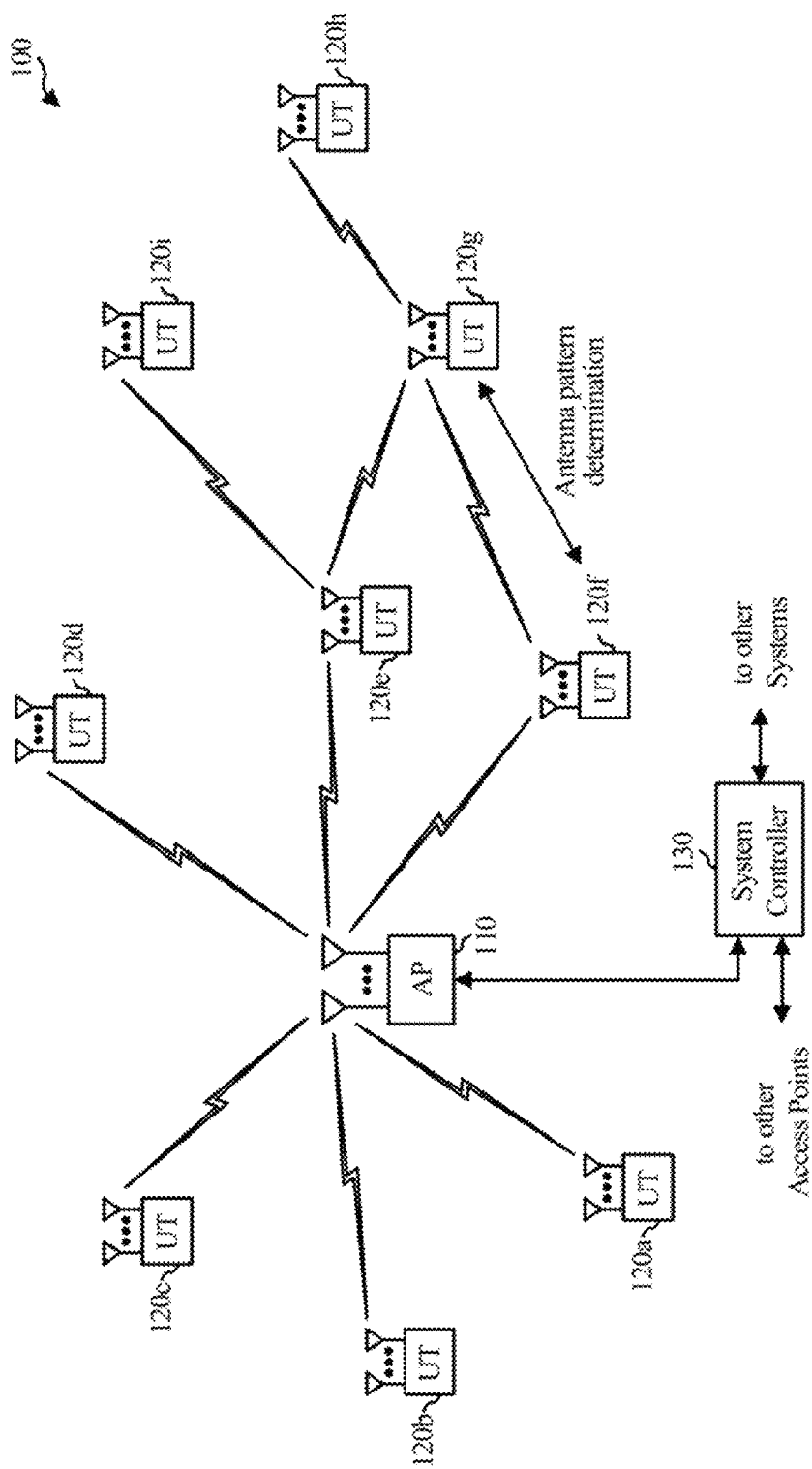
FIG. 1 illustrates a diagram of a wireless communications network, in accordance with certain aspects of the present disclosure.

According to aspects of the present disclosure, systems and techniques are provided to control power amplifiers.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The word "exemplary" is used herein to mean "serving as an example, instance, or illustration." Any aspect described herein as "exemplary" is not necessarily to be construed as preferred or advantageous over other aspects. Also as used herein, the term "legacy stations" generally refers to wireless network nodes that support 802.11n or earlier versions of the IEEE 802.11 standard.

The multi-antenna transmission techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement IEEE 802.11 or some other standards. A TDMA system may implement GSM or some other standards. These various standards are known in the art. Though some aspects are described herein with respect to a MIMO system, the techniques for power amplifier control described herein may be utilized with other systems including non-MIMO systems, such as other systems that utilize beamforming.

An Example MIMO System

FIG. 1 illustrates a multiple-access MIMO system 100 with access points and user terminals. For simplicity, only one access point 110 is shown in FIG. 1. An access point (AP) is generally a fixed station that communicates with the user terminals and may also be referred to as a base station or some other terminology. A user terminal may be fixed or mobile and may also be referred to as a mobile station, a station (STA), a client, a wireless device, or some other terminology. A user terminal may be a wireless device, such as a cellular phone, a personal digital assistant (PDA), a handheld device, a wireless modem, a laptop computer, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 is equipped with a number $N_{ap}$ of antennas and represents the multiple-input (MI) for downlink transmissions and the multiple-output (MO) for uplink transmissions. A set $N_u$ of selected user terminals 120 collectively represents the multiple-output for downlink transmissions and the multiple-input for uplink transmissions. In certain cases, it may be desirable to have $N_{ap} \geq N_u \geq 1$ if the data symbol streams for the $N_u$ user terminals are not multiplexed in code, frequency or time by some means. $N_u$ may be greater than $N_{ap}$ if the data symbol streams can be multiplexed using different code channels with CDMA, disjoint sets of sub-bands with OFDM, and so on. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

MIMO system 100 may be a time division duplex (TDD) system or a frequency division duplex (FDD) system. For a TDD system, the downlink and uplink share the same frequency band. For an FDD system, the downlink and uplink use different frequency bands. MIMO system 100 may also utilize a single carrier or multiple carriers for transmission. Each user terminal may be equipped with a single antenna (e.g., in order to keep costs down) or multiple antennas (e.g., where the additional cost can be supported).

Figure 2:
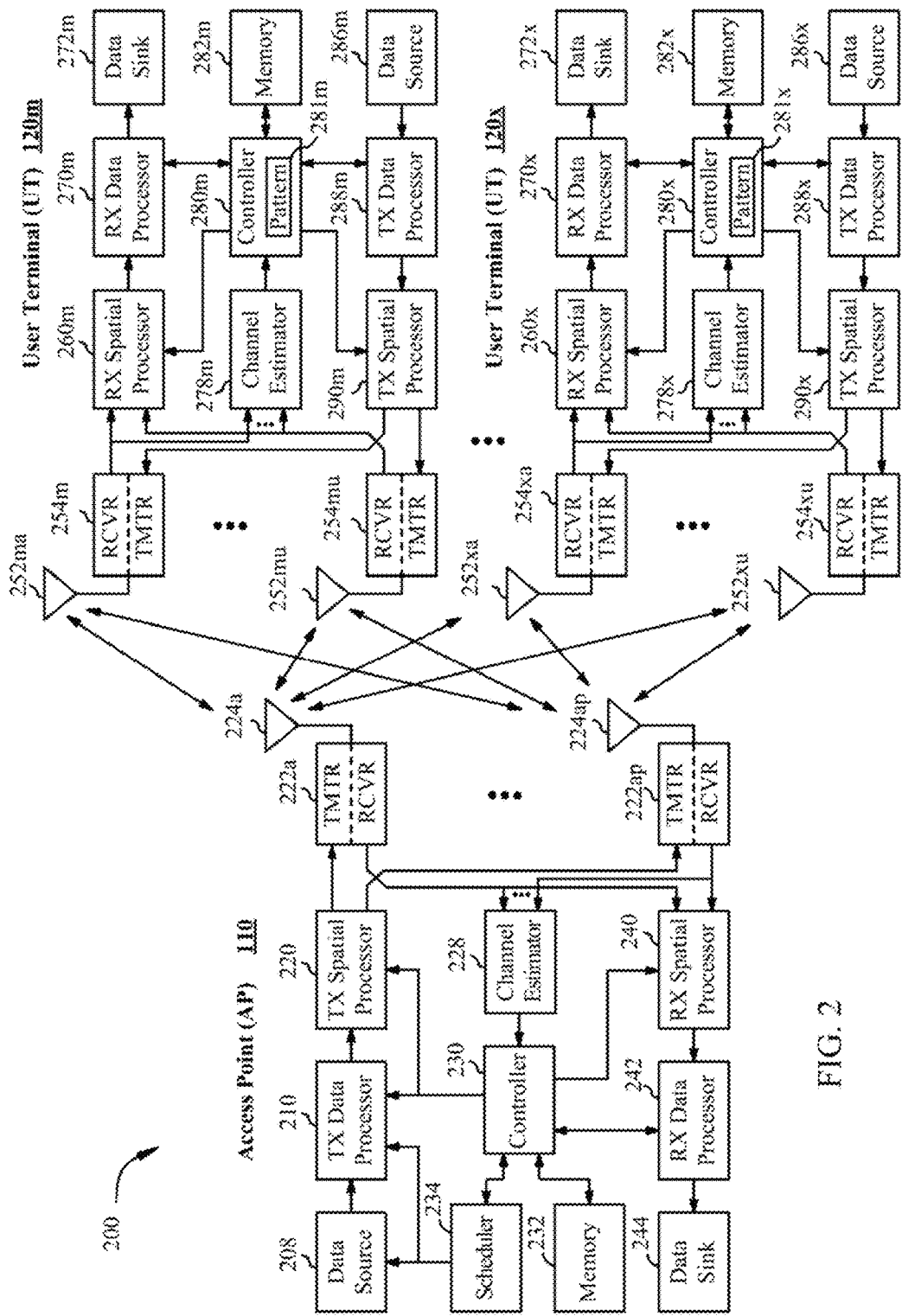
FIG. 2 illustrates a block diagram of an example access point and user terminals, in accordance with certain aspects of the present disclosure.

FIG. 2 shows a block diagram of access point 110 and two user terminals 120m and 120x in MIMO system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. The beam-steering or some other spatial processing technique may be used at the access point and user terminal.

On the uplink, at each user terminal 120 selected for uplink transmission, a TX data processor 288 receives traffic data from a data source 286 and control data from a controller 280. The controller may also include an antenna pattern determining component 281 that selects preferred transmit and receive antenna patterns (e.g., beamforming coefficients or calibration coefficients) for the user terminal 120. TX data processor 288 processes (e.g., encodes, interleaves, and modulates) the traffic data $\{d_{up,m}\}$ for the user terminal based on the coding and modulation schemes associated with the rate selected for the user terminal and provides a data symbol stream $\{s_{up,m}\}$. A TX spatial processor 290 performs spatial processing on the data symbol stream $\{s_{up,m}\}$ and provides $N_{ut,m}$ transmit symbol streams for the $N_{ut,m}$ antennas. Each transmitter unit (TMTR) 254 receives and processes (e.g., converts to analog, amplifies, filters, and frequency upconverts) a respective transmit symbol stream to generate an uplink signal. $N_{ut,m}$ transmitter units 254 provide $N_{ut,m}$ uplink signals for transmission from $N_{ut,m}$ antennas 252 to the access point 110.

A number $N_{up}$ of user terminals may be scheduled for simultaneous transmission on the uplink. Each of these user terminals performs spatial processing on its data symbol stream and transmits its set of transmit symbol streams on the uplink to the access point.

At access point 110, $N_{ap}$ antennas 224a through 224ap receive the uplink signals from all $N_{up}$ user terminals transmitting on the uplink. Each antenna 224 provides a received signal to a respective receiver unit (RCVR) 222. Each receiver unit 222 performs processing complementary to that performed by transmitter unit 254 and provides a received symbol stream. An RX spatial processor 240 performs receiver spatial processing on the $N_{ap}$ received symbol streams from $N_{ap}$ receiver units 222 and provides $N_{up}$ recovered uplink data symbol streams. The receiver spatial processing is performed in accordance with the channel correlation matrix inversion (CCMI), minimum mean square error (MMSE), successive interference cancellation (SIC), or some other technique. Each recovered uplink data symbol stream $\{\hat{s}_{up,m}\}$ is an estimate of a data symbol stream $\{s_{up,m}\}$ transmitted by a respective user terminal. An RX data processor 242 processes (e.g., demodulates, deinterleaves, and decodes) each recovered uplink data symbol stream $\{\hat{s}_{up,m}\}$ in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230, and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 provides $N_{dn}$ downlink data symbol streams for the $N_{dn}$ user terminals. A TX spatial processor 220 performs spatial processing on the $N_{dn}$ downlink data symbol streams, and provides $N_{ap}$ transmit symbol streams for the $N_{ap}$ antennas. Each transmitter unit (TMTR) 222 receives and processes a respective transmit symbol stream to generate a downlink signal. $N_{ap}$ transmitter units 222 provide $N_{ap}$ downlink signals for transmission from $N_{ap}$ antennas 224 to the user terminals.

At each user terminal 120, $N_{ut,m}$ antennas 252 receive the $N_{ap}$ downlink signals from access point 110. Each receiver unit (RCVR) 254 processes a received signal from an associated antenna 252 and provides a received symbol stream. An RX spatial processor 260 performs receiver spatial processing on $N_{ut,m}$ received symbol streams from $N_{ut,m}$ receiver units 254 and provides a recovered downlink data symbol stream $\{\hat{s}_{dn,m}\}$ for the user terminal. The receiver spatial processing is performed in accordance with the CCMI, MMSE, or some other technique. An RX data processor 270 processes (e.g., demodulates, deinterleaves, and decodes) the recovered downlink data symbol stream to obtain decoded data for the user terminal.

At each user terminal 120, $N_{ut,m}$ antennas 252 receive the $N_{ap}$ downlink signals from access point 110. Each receiver unit (RCVR) 254 processes a received signal from an associated antenna 252 and provides a received symbol stream. An RX spatial processor 260 performs receiver spatial processing on $N_{ut,m}$ received symbol streams from $N_{ut,m}$ receiver units 254 and provides a recovered downlink data symbol stream $\{\hat{s}_{dn,m}\}$ for the user terminal. The receiver spatial processing is performed in accordance with the CCMI, MMSE, or some other technique. An RX data processor 270 processes (e.g., demodulates, deinterleaves, and decodes) the recovered downlink data symbol stream to obtain decoded data for the user terminal.

Figure 3:
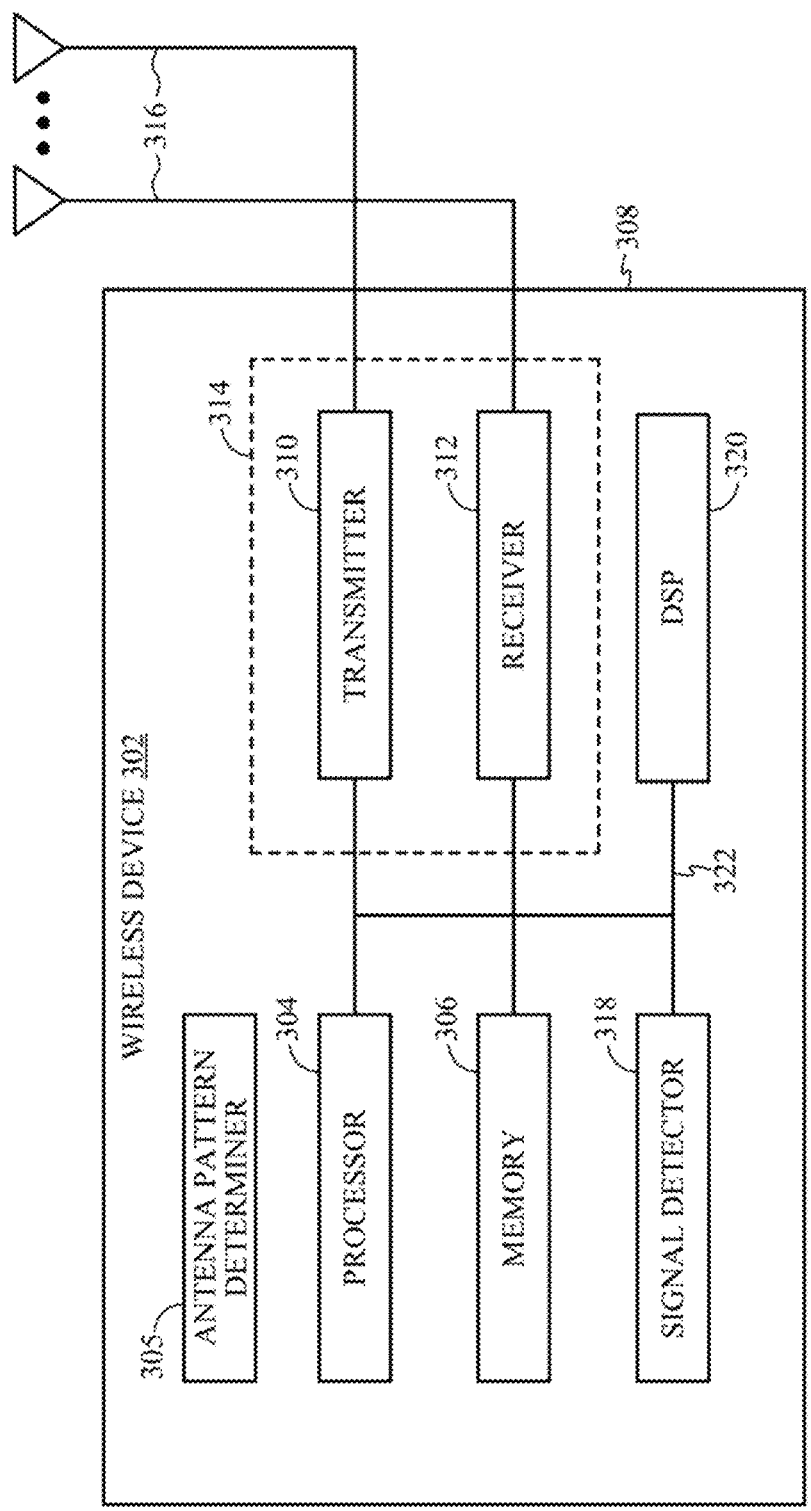
FIG. 3 illustrates a block diagram of an example wireless device, in accordance with certain aspects of the present disclosure.

FIG. 3 illustrates various components that may be utilized in a wireless device 302 that may be employed within the system 100. The wireless device 302 is an example of a device that may be configured to implement the various methods described herein. The wireless device 302 may be an access point 110 or a user terminal 120.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A plurality of transmit antennas 316 may be attached to the housing 308 and electrically coupled to the transceiver 314. The wireless device 302 may also include (not shown) multiple transmitters, multiple receivers, and multiple transceivers.

The wireless device 302 may also include an antenna pattern determiner 305 that determines transmit and receive antenna patterns (e.g., beamforming coefficients) for the plurality of transmit and receive antennas 316.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

The various components of the wireless device 302 may be coupled together by a bus system 322, which may include a power bus, a control signal bus, and a status signal bus in addition to a data bus.

Beamforming may be an element of communications in high frequency bands such as 60 GHz (e.g., millimeter wavelength (mmWave)). Though beamforming is described herein with respect to a MIMO system, it should be noted that beamforming may be utilized with non-MIMO systems. Further, the techniques described herein with respect to power amplifier control may be utilized with both MIMO and non-MIMO systems that utilize beamforming. The transmitter 310 may transmit one or more signals from a plurality of transmit antennas 316. The signals may be multiplied with beamforming coefficients (e.g., beamforming weights) before transmission in the correct direction. The beamforming weights $w_1, w_2, \ldots, w_M$ for M antennas 316 of the transmitter 310 may be selected from a defined finite set of values A (e.g., an alphabet). As an example, A may be equal to the set $\{+1, j, -1, -j\}$, as suggested in the IEEE 802.15.3c beamforming codebooks. The beamforming weights may be written as follows:

$$w_m = e^{jk_m\pi/2}, k_1, \ldots, k_M \in \{0,1,2,3\}$$

Example Techniques for Power Amplifier Control

In certain aspects, a wireless device (e.g., wireless device 302) may include multiple antennas (e.g., a multi-antenna phased array) for transmission of wireless signals. Use of multiple antennas, may present problems with respect to power consumption. For example, each of the multiple antennas may be driven by a power amplifier (PA). The PAs may achieve maximum efficiency when driven into compression. However, once the compression point is reached, the PA has a non-linear behavior, in that the output is a non-linear function of the input.

Non-linear behavior of the PA may result in degraded adjacent channel leakage power ratio (ACLR) (e.g., a measure of the amount of power leaking into adjacent channels calculated as the ratio of the transmitted power to the power in the adjacent radio channel). Further, non-linear behavior may result in degraded error vector magnitude (EVM) (e.g., the measure used to quantify performance of a digital transceiver calculated as the deviation of the actual constellation point of a signal from the ideal location in a signal space diagram). The non-linear behavior of each PA can be described by a Taylor or Volterra series expansion. The terms of the expansion are a function of the compression depth of the PA.

Figure 4:
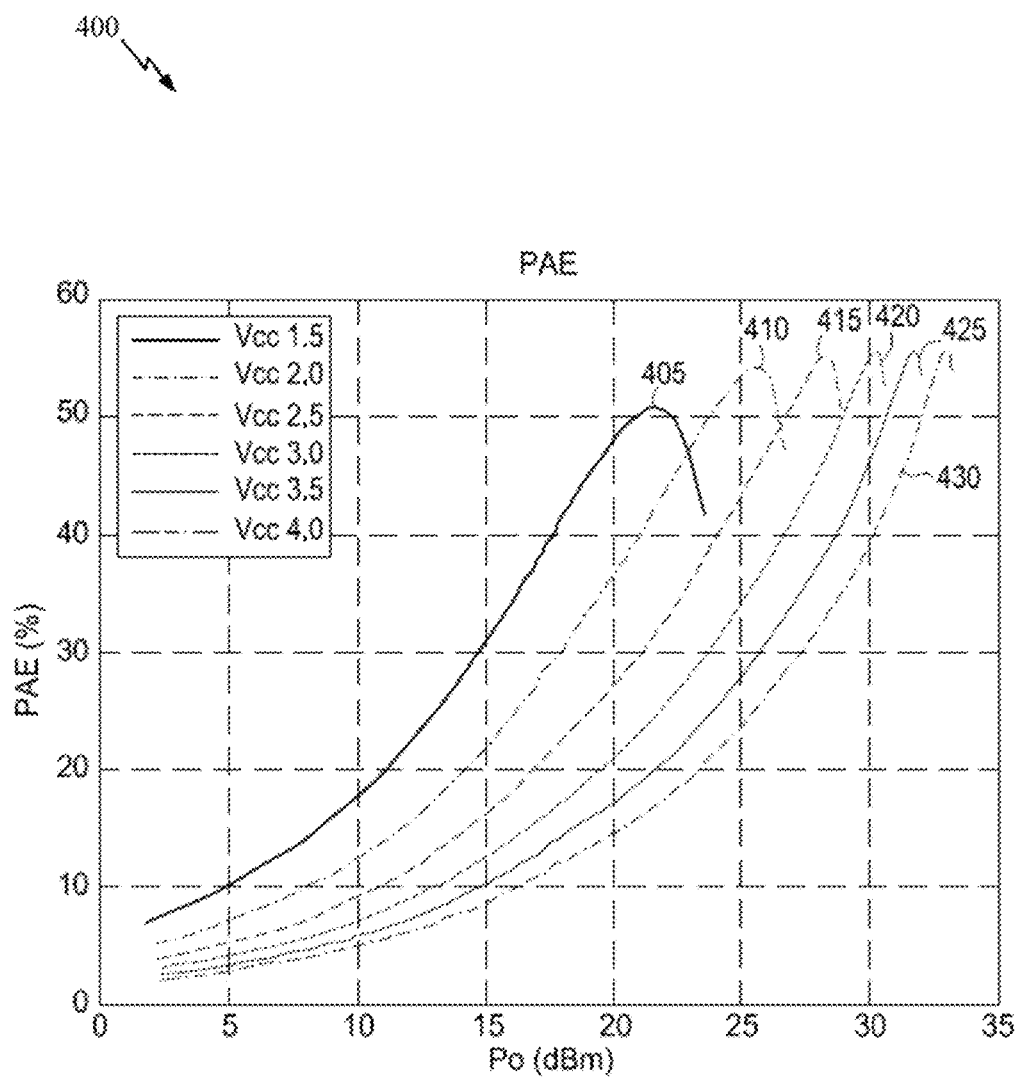
FIG. 4 illustrates a graph showing the power added efficiency (PAE) as a function of output power for an example power amplifier (PA).

FIG. 4 illustrates a graph 400 showing the power added efficiency (PAE) as a function of output power for an example PA. As shown, the Y-axis indicates the PAE in percentage for the PA, and the X-axis indicates the output power of the PA in dBm. Each curve 405-430 represents the PAE as a function of output power at a different collector voltage ($V_{CC}$) applied to a collector terminal of the PA. Curve 405 represents the PAE where $V_{CC}$=1.5V. Curve 410 represents the PAE where $V_{CC}$=2.0V. Curve 415 represents the PAE where $V_{CC}$=2.5V. Curve 420 represents the PAE where $V_{CC}$=3.0V. Curve 425 represents the PAE where $V_{CC}$=3.5V. Curve 430 represents the PAE where $V_{CC}$=4.0V. As can be seen, the peak PAE is different for each value of $V_{CC}$ and therefore depends on $V_{CC}$.

Figure 5:
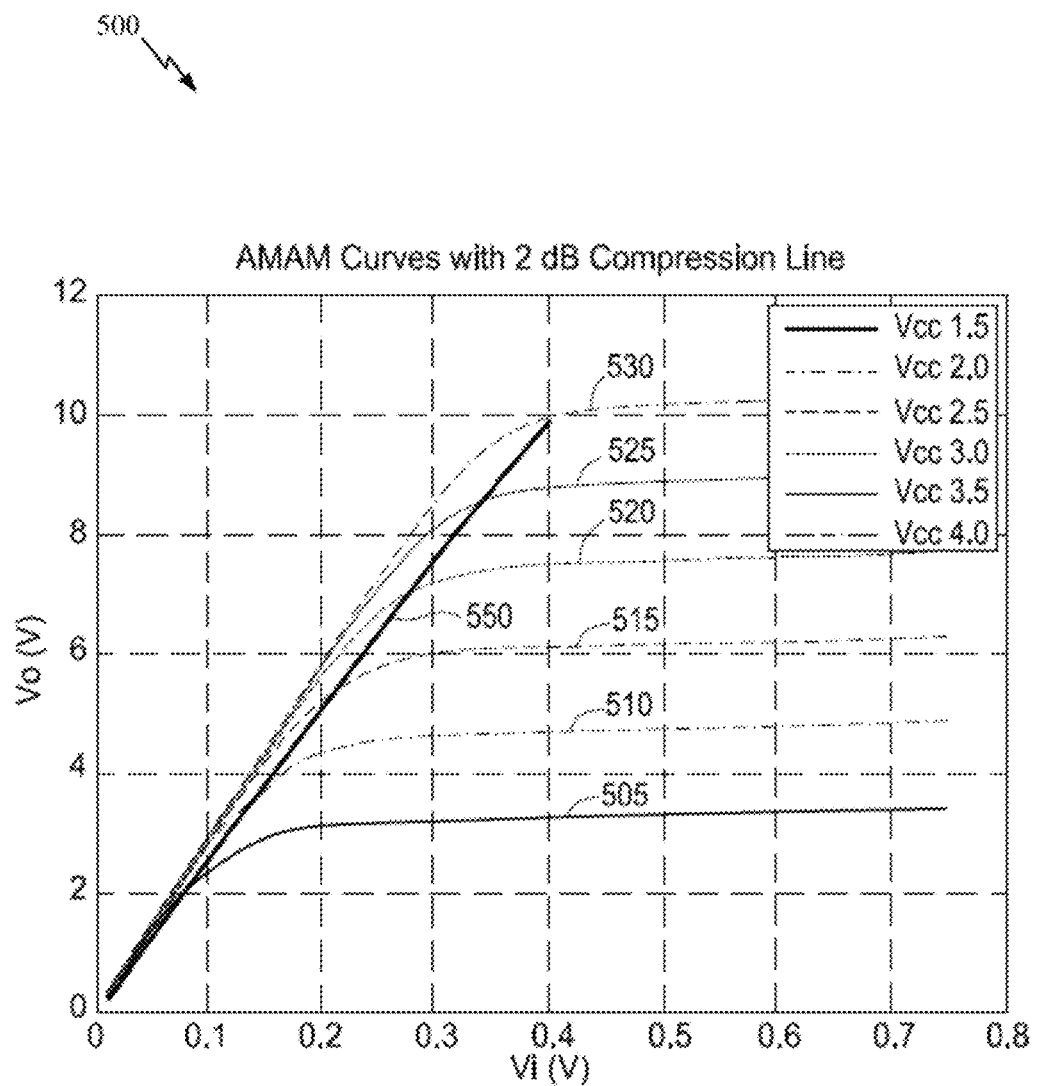
FIG. 5 illustrates a graph showing the amplitude-to-amplitude modulation (AMAM) characteristics for an example PA.

FIG. 5 illustrates a graph 500 showing the amplitude-to-amplitude modulation (AMAM) characteristics for an example PA. As shown, the Y-axis indicates the output voltage ($V_{OUT}$) of the output signal of the PA, and the X-axis indicates the input voltage ($V_{IN}$) of the input signal of the PA. Each curve 505-530 represents the AMAM characteristics at a different collector voltage ($V_{CC}$) applied to a collector terminal of the PA. Curve 505 represents the AMAM characteristics where $V_{CC}$=1.5V. Curve 510 represents the AMAM characteristics where $V_{CC}$=2.0V. Curve 515 represents the AMAM characteristics where $V_{CC}$=2.5V. Curve 520 represents the AMAM characteristics where $V_{CC}$=3.0V. Curve 525 represents the AMAM characteristics where $V_{CC}$=3.5V. Curve 530 represents the AMAM characteristics where $V_{CC}$=4.0V.

As shown in graph 500, for each curve 505-530, as $V_{IN}$ is increased, $V_{OUT}$ increases substantially linearly until the PA reaches the compression point. After the compression point, the PA behavior (e.g., relationship between $V_{IN}$ and $V_{OUT}$) is no longer linear. In FIG. 5, the intersection of the line 550 with each of the curves 505-530 represents the 2 dB compression point for the respective curve. As can be seen, the compression point is different for each value of $V_{CC}$ and therefore depends on $V_{CC}$.

As discussed above, and based on the graphs 400 and 500, in order to achieve efficiency, it may be desirable to operate the PA near the compression region. However, the non-linear behavior of the PA may adversely affect performance (e.g., ACLR, EVM, etc.).

In certain aspects, digital pre-distortion (DPD) may be used to compensate for the non-linear behavior of the PA running past the compression point. In particular, DPD is a linearization technique where the input signal to the PA is pre-distorted (i.e., a function is applied to change the input signal) so that the output of the PA based on the pre-distorted input signal is a linear function of the original input signal.

Figure 6:
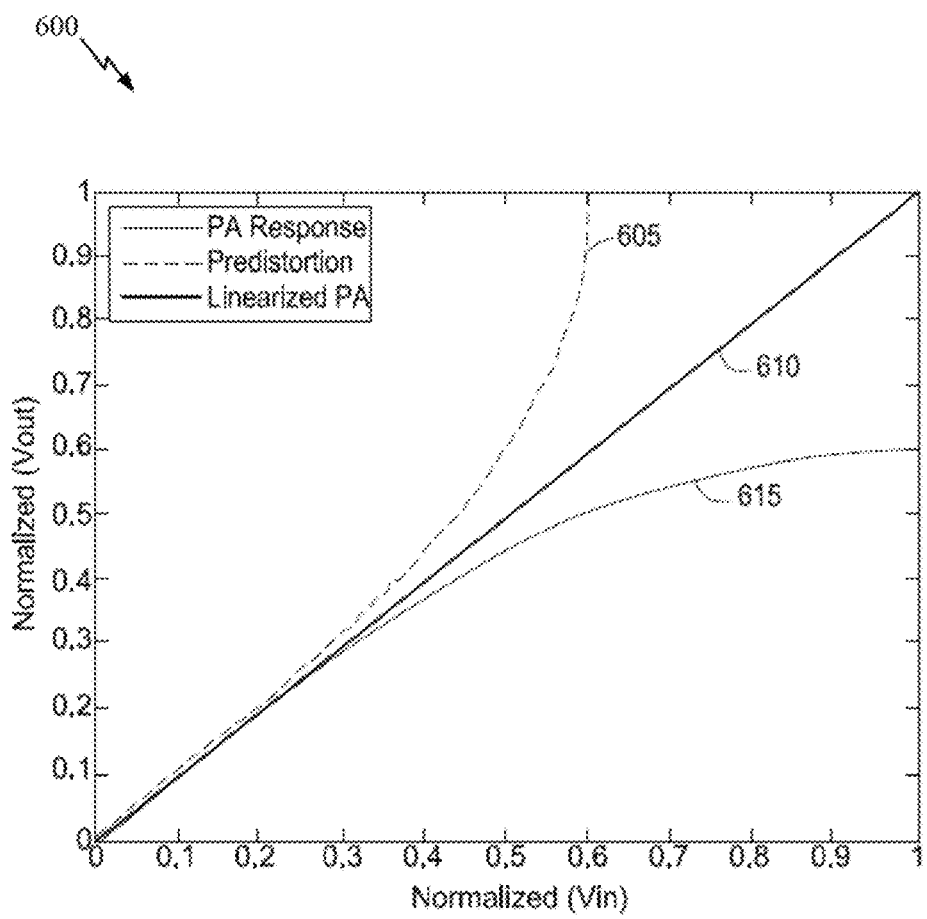
FIG. 6 illustrates the relationship of $V_{OUT}$ to $V_{IN}$ of various elements including an example PA and an example digital pre-distortion (DPD) processing circuit.

For example, FIG. 6 illustrates the relationship of $V_{OUT}$ to $V_{IN}$ for various elements. As shown, the Y-axis indicates the output voltage ($V_{OUT}$) of the output signal, and the X-axis indicates the input voltage ($V_{IN}$) of the input signal. The curve 615 illustrates the AMAM characteristics of a PA based on an input signal to the PA without pre-distortion applied. As shown, the curve 615 illustrates a non-linear response at the PA past the compression point.

In certain aspects, the purpose of DPD may be to generate an approximately inverse waveform of the curve 615. Accordingly, the curve 605 illustrates the input to output relationship of a DPD block configured to apply a DPD function to an input signal. As shown, the curve 605 applies a function that is approximately an inverse to the response of the PA represented by the curve 615. The DPD function may be generated and calibrated, for example, by sampling the PA output and constructing an appropriate linearization function (e.g., at a given $V_{CC}$). In particular, the DPD function may be defined by utilizing a Taylor or Volterra series expansion, or may be defined by a look-up table (LUT), that may be stored in memory of a device applying the DPD function.

The linear curve 610 illustrates the output of the PA based on a pre-distorted input signal. The pre-distorted input signal is generated by a DPD function as illustrated by curve 605 being applied to the input signal as represented by curve 615. As shown, the pre-distorted signal has an approximately linear response as illustrated by curve 610. Accordingly, as shown, applying DPD to the input signal of a PA can create an approximately linear output response for the PA (with respect to the original input signal), even past the normal compression point of the PA. Thus, in certain aspects, application of DPD to the input of a PA may be beneficial to operate the PA in the compression region, while avoiding the adverse effects of a non-linear response by the PA.

Figure 6A:
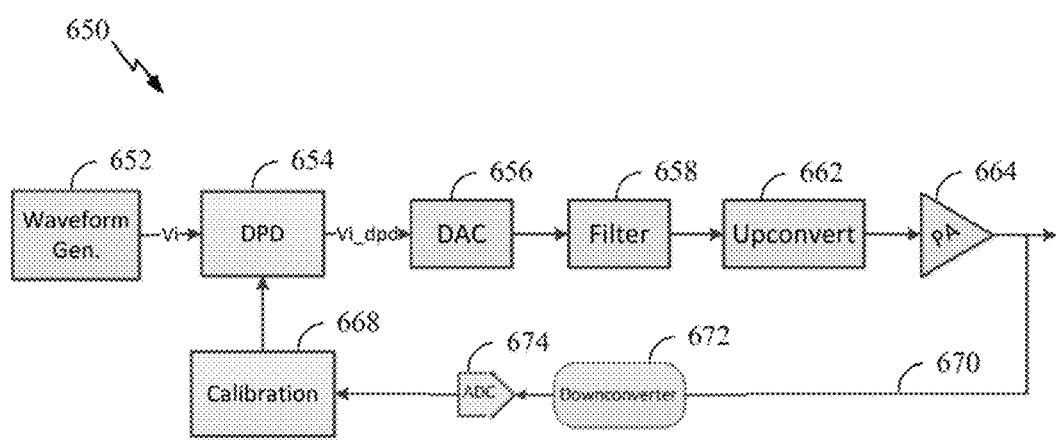
FIG. 6A illustrates a block diagram of an example architecture for applying DPD to a waveform to achieve a linear output response from an example PA.

FIG. 6A illustrates a block diagram of an example architecture for applying DPD to a waveform to achieve a linear output response from a PA. As shown, the DPD architecture 650 includes a waveform generator 652 configured to generate an input signal for transmission. The architecture 650 further includes a DPD processing circuit 654 coupled to the waveform generator 652 and configured to receive the input signal from the waveform generator 652. The DPD processing circuit 654 may be configured to apply a DPD function to the input signal. The architecture 650 may further include, for example, a digital-to-analog converter (DAC) 656, a filter 658, an upconverter 662, a PA 664, and a calibration circuit 668. For example, the DAC 656 may be coupled to the DPD processing circuit 654 and configured to receive the pre-distorted input signal from the DPD processing circuit 654. The DAC 656 may be configured to convert the pre-distorted input signal from a digital signal to an analog signal. Further, the filter 658 may be coupled to the DAC 656 and configured to receive the analog input signal from the DAC 656. The filter 658 may filter certain frequency components of the analog input signal. The upconverter 662 may be coupled to the filter 658 and configured to receive the filtered input signal from the filter 658. The upconverter 662 may upconvert the filtered input signal to a higher band of frequencies. The PA 664 may be coupled to the upconverter 662 and configured to receive the upconverted signal from the upconverter 662. The PA 664 may amplify the upconverted signal, such as for transmission.

The output of the PA 664 may be used as input to a feedback path 670. The feedback path 670 may be coupled from the output of PA 664 to the DPD processing circuit 354. In particular, the feedback path 670 includes a downconverter 672, an analog-to-digital converter (ADC) 674, and a calibration circuit 668. The downconverter 672 is shown as coupled to the output of the PA 664. The downconverter 672 is configured to receive as input and downconvert the output signal of the PA 664 to a lower band of frequencies. The downconverter 672 is further coupled to the ADC 674, which is configured to receive the downconverted signal as input from the downconverter 672 and convert the analog signal to a digital signal. The ADC 674 is further coupled to a calibration circuit 668. The calibration circuit 668 may, for example, compare the output of the PA 664 based on the DPD function applied to the input signal by the DPD processing circuit 654. The calibration circuit 668 may adjust the DPD function based on any error detected by the calibration circuit 668 so as to achieve a more linear response from the PA 664 with respect to the original input signal generated by the waveform generator 652.

Figure 7:
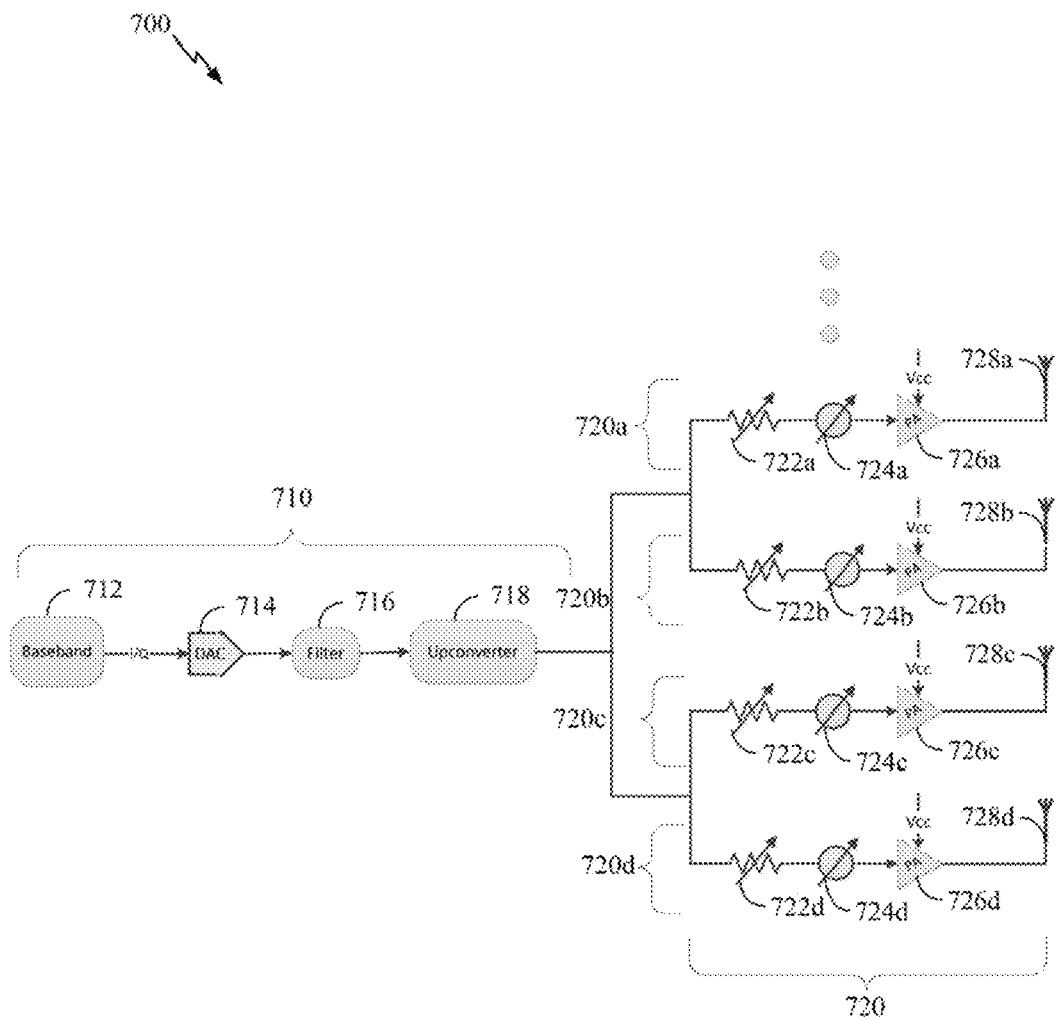
FIG. 7 illustrates a block diagram of an example transmit architecture.

FIG. 7 illustrates a block diagram of a transmit architecture (e.g., mmWave transmit architecture) 700. As shown, the transmit architecture 700 includes multiple antennas 728a-728d for transmission. It should be noted that transmit architecture 700 may include additional or fewer antennas 728 than shown. The multiple antennas 728 of transmit architecture 700 may allow the transmit architecture 700 to be used to perform techniques such as beamforming.

In particular, each antenna 728a-728d is associated with a separate signal processing path 720a-720d, respectively. Each signal processing path 720a-720d includes a respective attenuator 722a-722d, which may be coupled to a respective phase shifter 724a-724d, which may be coupled to a respective PA 726a-726d, and which may be coupled to a respective antenna 728a-728d. For example, the processing path 720a includes: the attenuator 722a configured to reduce the strength of the radio signal for transmission by the antenna 728a; the phase shifter 724a configured to control the phase of the radio signal for transmission by the antenna 728a; the PA 726a configured to drive the antenna 728a; and the antenna 728a to transmit a radio signal processed by the signal processing path 720a.

The transmit architecture 700 may be used for beamforming by varying the amplitude and phase of the signal output by each antenna 728a-728d in order to focus the energy in one direction and reduce sidelobes (e.g., the output signal is large in the direction desired, and minimized in areas the output signal is not desired, which may be referred to as sidelobes) from the output of the transmit architecture 700. In particular, such output signals transmitted by each of the antennas 728a-728d may experience constructive interference at certain angles and destructive interference at certain angles.

For example, beamforming may be achieved in part by performing amplitude tapering by varying the input power of the input signal to each of the PAs 726a-726d. Alternatively, a technique known as eigenvector beamforming may result in different PAs operating with different input powers. In particular, the input power of the input signal to each of the PAs 726a-726d may be varied by the respective attenuator 722a, and phase shifted by the respective phase shifter 724a-724d, such that the input power of an input signal to one PA 726 may be different than another PA 726. In particular, each PA 726a-726d may receive as input an input signal with a different input power. In certain aspects, some of the PAs 726a-726d may have an input signal with the same input power, but at least one PA 726a-726d may have an input signal with a different input power than another PA 726a-726d at some time during operation of the transmit architecture 700. It should be noted that though variance of input power for the input signal for the PAs 726 is described with respect to performance of beamforming, such variance may be due to other techniques applied to the input signals.

Each of the signal processing paths 720a-720d (e.g., via the attenuators 722a-722d) may be coupled to and configured to receive a common signal from a common input path 710. In particular, the common signal from the common input path 710 may be differently attenuated, phase shifted, and amplified for transmission along each of the signal processing paths 720a-720d, but the common signal itself is still the same shared input signal to each of the signal processing paths 720a-720d. This may allow for techniques such as beamforming, which require the same common signal (though attenuated and phase shifted differently) be transmitted from each of the multiple antenna 728a-728d to achieve the desired interference and signal transmission.

The common input path 710 may for example, receive an input signal for transmission from a signal generator, such as a baseband signal generator 712 (e.g., DSP 320). It should be noted that any appropriate input signal from transmission may be received along the common input path 710 from any suitable source. The common input path may further comprise, for example, a digital-to-analog converter (DAC) 714, a filter 716, and an upconverter 718. For example, the DAC 714 may be coupled to the signal generator 712 and configured to receive the input signal from the signal generator 712. The DAC 714 may be configured to convert the input signal from a digital signal to an analog signal. Further, the filter 716 may be coupled to the DAC 714 and configured to receive the analog input signal from the DAC 714. The filter 716 may filter certain frequency components of the analog input signal. The upconverter 718 may be coupled to the filter 716 and configured to receive the filtered input signal from the filter 716. The upconverter 718 may upconvert the filtered input signal to a higher band of frequencies.

The output of the upconverter 718 may be the source of the common input signal to each of the signal processing paths 720a-720d and therefore may be coupled to each of the signal processing paths 720a-720d (e.g., via the attenuators 722a-722d). For example, the common input signal may be split into multiple paths (e.g., using Wilkinson splitters), each path corresponding to one of the signal processing paths 720a-720d.

As discussed herein, it may be beneficial to operate each of the PAs 726a-726d in the compression region for each PA 726. Further, it may be beneficial to apply DPD to each of the signals applied to each of the PAs 726a-726d to avoid non-linear behavior of the PA with respect to the input signal. However, as discussed herein, the input power (e.g., input voltage) of each of the signals applied to each of the PAs 726a-726d may be different (e.g., when performing beamforming) and therefore each PA 726a-726d may be operating at a different compression point (e.g., as discussed with respect to graphs 400 and 500). Therefore, each PA 726a-726d may require a different DPD to be applied to the signal input into the PA 726a-726d.

However, in certain aspects, each of the PAs 726a-726d of the transmit architecture 700 may be formed on the same die and therefore exhibit similar compression characteristics. Therefore, the same DPD function may be able to be applied to each of the input signals for each of the PAs 726a-726d if they are operating at the same compression point. However, in certain aspects, the inputs (e.g., input power of the input signal) of the DPD function for each PA 726a-726d may be different, and therefore a separate DPD processing circuit (e.g., one or more processors) may be needed to apply the DPD function to apply DPD to the different input signal for each of the PAs 726a-726d.

Figure 8:
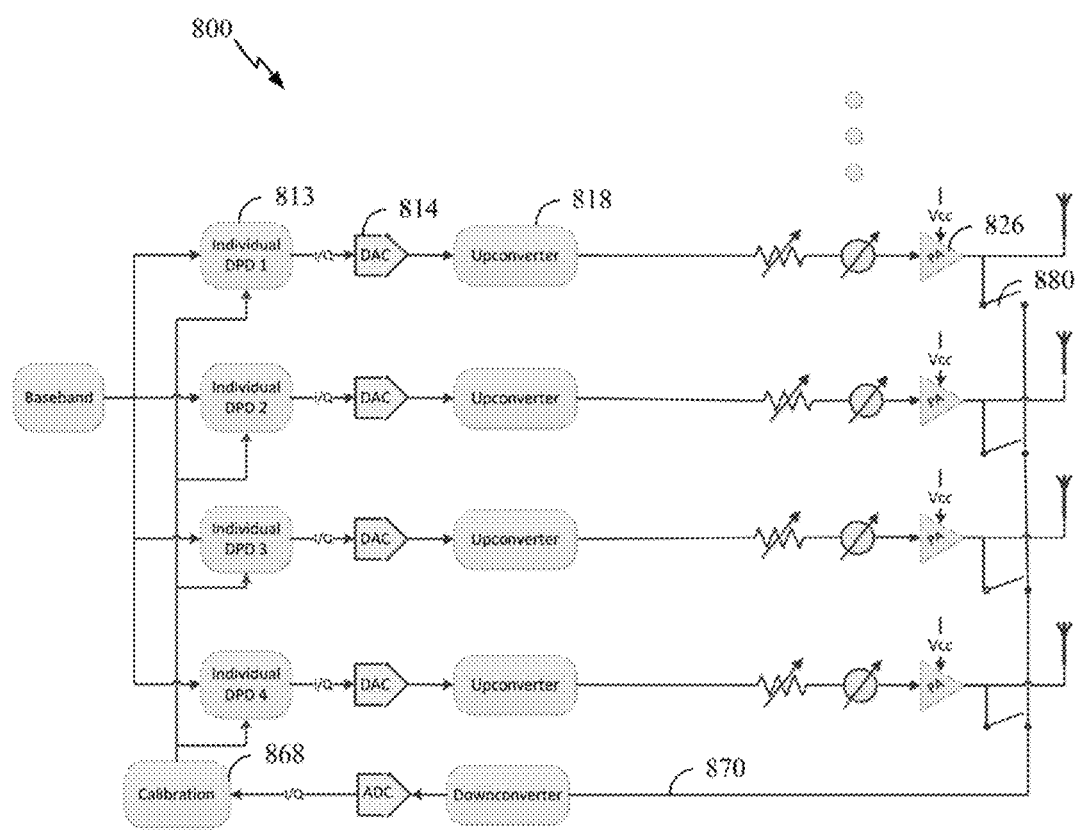
FIG. 8 illustrates a block diagram of an example transmit architecture for implementing DPD.

In certain aspects, a separate DPD processing circuit may be used for each PA in a transmit architecture to ensure the proper DPD is applied to each of the different input signals for each of the PAs. For example, FIG. 8 illustrates an example of such a transmit architecture 800.

As shown, the transmit architecture 800 includes multiple DPD processing circuits 813, one for each PA 826. Each PA 826 may be operating with the same constant $V_{CC}$ applied to the PA 826. However, the input signal to each of the PAs 826 may be different, and therefore a different DPD processing circuit 813 is needed to apply the correct DPD to each input signal.

Accordingly, the transmit architecture further includes multiple DACs 814 and upconverters 818, one set for each DPD processing circuit 813. Therefore, the transmit architecture 800 requires significantly greater circuitry than the transmit architecture 700 in order to implement DPD, which may require the use of significantly greater die area than the transmit architecture 700.

In addition, the transmit architecture 800 may require that each DPD processing circuit 813 be individually calibrated based on the output of its respective PA 826. Accordingly, the output of each PA 826 is coupled to a switch 880, such that the output of each PA can be individually fed back along a feedback path 870 to a calibration circuit 868. The calibration circuit 868 may then individually calibrate each DPD processing circuit 813. The additional switching circuitry for switches 880 may require additional circuitry and logic to control the switches, additional die area to implement the switches, and additional time to individually calibrate each DPD processing circuit 813.

In certain aspects, it may be desirable to implement DPD in a transmit architecture without requiring a separate DPD processing circuit for each PA in the transmit architecture. However, as discussed above, when operating (e.g., when amplitude tapering is performed when beamforming), each PA may be operating at different compression points, and therefore require a different DPD processing circuit to apply DPD for each of the different power input signals for each PA.

Figure 9:
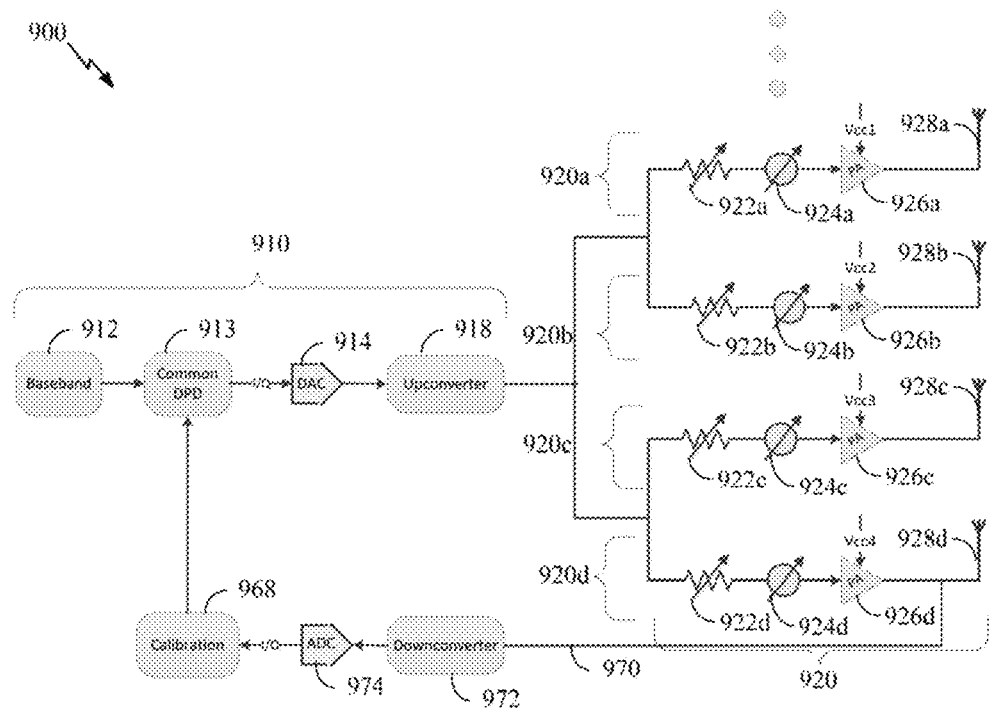
FIG. 9 illustrates a block diagram of another example transmit architecture for implementing DPD.

Accordingly, in certain aspects, systems and methods are described herein that allow each of the PAs to operate at the same compression point. Therefore, in some aspects, only a single DPD processing circuit is needed to apply a DPD function to the input for each PA. In particular, in certain aspects, each of the PAs of a transmit architecture may be formed on the same die and therefore exhibit similar compression characteristics. Therefore, in some aspects, the same DPD function may be able to be applied to each of the input signals for each of the PAs. Further, though the power of the input signal to each PA may be different, in certain aspects, the collector voltage $V_{CC}$ applied to each PA may be varied in conjunction with the varying of the power of the input signal to the PA, such that the nonlinear behavior of each PA is substantially the same. Therefore, each PA may run at substantially the same compression point, since the AMAM characteristics of the PA is based on both the $V_{CC}$ and the power of the input signal as discussed and shown with respect to FIG. 5. In some other aspects, the PA bias may be adjusted in addition to or instead of the $V_{CC}$ applied to each PA, such that the nonlinear behavior of each PA is substantially the same. For example, the PA bias may refer to the PA gate bias, the PA base bias voltage, or the PA bias current. Since each of the PAs may therefore run at substantially the same compression point, in some aspects, a single DPD, using a single DPD function, can be applied to a common signal that is then split and input into each of the PAs. In particular, FIG. 9 illustrates an example of such a transmit architecture 900. It should be noted that the techniques herein may be applied to any appropriate power amplifier network, and not just the transmit architectures described herein. Further, it should be noted that though techniques are described herein with respect to a single DPD processing circuit to apply a DPD function to the input for each PA, the techniques herein may be used to allow each of the PAs to operate at the same compression point for any common input signal. For example, the common input signal need not have a DPD function applied to it. The common input signal may be received from any suitable source, such as, a baseband processor (e.g., DSP 320). Further, a feedback path as discussed herein may be coupled to the source (e.g., baseband processor) instead of the DPD processing circuit to allow the source to adjust the common input signal.

As shown, the transmit architecture 900 includes multiple antennas 928a-928d for transmission. It should be noted that transmit architecture 900 may include additional or fewer antennas 928 than shown. The multiple antennas 928 of transmit architecture 900 may allow the transmit architecture 900 to be used to perform techniques such as beamforming.

In particular, each antenna 928a-928d is associated with a separate signal processing path 920a-920d, respectively. Each signal processing path 920a-920d includes a respective attenuator 922a-922d, a respective phase shifter 924a-924d, a respective PA 926a-926d, and a respective antenna 928a-928d. For example, the processing path 920a includes: the attenuator 922a configured to reduce the strength of the radio signal for transmission by the antenna 928a; the phase shifter 924a configured to control the phase of the radio signal for transmission by the antenna 928a; the PA 926a configured to drive the antenna 928a; and the antenna 928a to transmit a radio signal processed by the signal processing path 920a. As shown, each of the attenuators 922a-922d is coupled to the respective phase shifter 924a-924d, which is further coupled to the respective PA 926a-926d, which is further coupled to the respective antenna 928a-928d.

Similar to the transmit architecture 700, the transmit architecture 900 may be used for beamforming by varying the amplitude and phase of the signal output by each antenna 928a-928d in order to focus the energy from the output of the transmit architecture 900. Accordingly, as discussed with respect to the transmit architecture 700, each PA 926a-926d may receive as input an input signal with a different input power. For example, the input power of the input signal to each of the PAs 926a-926d may be varied by the respective attenuator 922a-922d, and phase shifted by the respective phase shifter 924a-924d, such that the input power of an input signal to one PA 926 may be different than another PA 926.

Figure 9A:
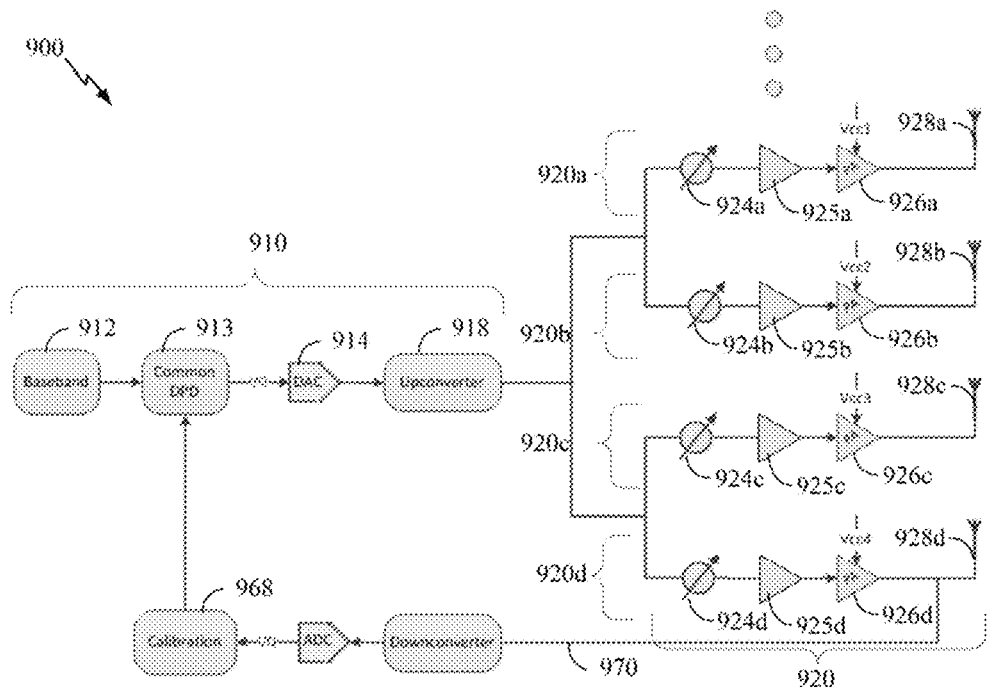
FIG. 9A illustrates a block diagram of another example transmit architecture for implementing DPD.

In some aspects, instead of or in addition to each signal processing path 920a-920d including a respective attenuator 922a-922d, as shown in FIG. 9, each signal processing path 920a-920d may include a variable gain amplifier. The variable gain amplifier may be configured to adjust the input power of the input signal to each of the PAs 926a-926d by adjusting the gain the variable gain amplifier applies to the input signal. For example, FIG. 9A illustrates an example of such a transmit architecture 900 with such signal processing paths 920a-920d. As shown, each signal processing path 920a-920d includes a respective phase shifter 924a-924d, a respective variable gain amplifier 925a-925d, a respective PA 926a-926d, and a respective antenna 928a-928d. For example, the processing path 920a includes: the phase shifter 924a configured to control the phase of the radio signal for transmission by the antenna 928a; the variable gain amplifier 925a configured to adjust the power of the input signal for transmission by the antenna 928a; the PA 926a configured to drive the antenna 928a; and the antenna 928a to transmit a radio signal processed by the signal processing path 920a. As shown, each of the phase shifters 924a-924d is coupled to the respective variable gain amplifier 925a-925d, which is further coupled to the respective PA 926a-926d, which is further coupled to the respective antenna 928a-928d.

In some aspects, instead of including a separate variable gain amplifier 925a-925d in each signal processing path 920a-920d, as shown in FIG. 9A, the function described herein with respect to the variable gain amplifier may be incorporated in the PA 926a-926d of each of the signal processing paths 920a-920d. Accordingly, though the variable gain amplifiers 925a-925d and PAs 926a-926d are shown as separate components in FIG. 9A, the function of each may be performed by a single group of components (e.g., PAs 926a-926d). For example, the input stages of the PA 926a-926d may be used to perform the function of a variable gain amplifier. In another example, the transconductance ($g_m$) of the PAs 926a-926d may be adjusted while the interstage load impedances and output stage load impedances of the PAs 926a-926d are not deliberately changed to perform the function of a variable gain amplifier.

In certain aspects, some of the PAs 926a-926d may have an input signal with the same input power, but at least one PA 926a-926d may have an input signal with a different input power than another PA 926a-926d at some time during operation of the transmit architecture 900. For example, symmetric antennas (e.g., antennas for transmitting that are symmetrically placed with respect to one another with respect to the desired direction of signal transmission) may be configured to transmit signals with the same power. Therefore the PAs 926a-926d associated with antennas that are symmetric may be configured to receive, as input, signals with the same power. It should be noted that though variance of input power for the input signal for the PAs 926 is described with respect to performance of beamforming, such variance may be due to other techniques applied to the input signals.

Each of the signal processing paths 920a-920d (e.g., via the attenuators 922a-922d and/or phase shifters 924a-924d) may be coupled to and configured to receive a common signal from a common input path 910. In particular, the common signal from the common input path 910 may be differently attenuated/amplified, phase shifted, and amplified for transmission along each of the signal processing paths 920a-920d, but the common signal itself is still the same shared input signal to each of the signal processing paths 920a-920d. This may allow for techniques such as beamforming, which require the same common signal (though attenuated/amplified and phase shifted differently) be transmitted from each of the multiple antenna 928a-928d to achieve the desired interference and signal transmission.

The common input path 910 may for example, receive an input signal for transmission from a signal generator, such as a baseband signal generator 912 (e.g., baseband processor (e.g., DSP 320)). It should be noted that any appropriate input signal for transmission may be received along the common input path 910 from any suitable source. The common input path may further comprise a single DPD processing circuit 913 coupled to the signal generator 912 and configured to receive the input signal from the signal generator 912. The DPD processing circuit 913 may be configured to apply a single DPD function to the input signal to generate a single pre-distorted input signal. The common input path 910 may further include a digital-to-analog converter (DAC) 914 and an upconverter 918. For example, the DAC 914 may be coupled to the DPD processing circuit 913 and configured to receive the pre-distorted input signal from the DPD processing circuit 913. The DAC 914 may be configured to convert the pre-distorted input signal from a digital signal to an analog signal. The upconverter 918 may be coupled to the DAC 914 and configured to receive the analog input signal from the DAC 914. The upconverter 918 may upconvert the analog input signal to a higher band of frequencies. In some aspects, the upconverter 918 may include a driver stage amplifier after a mixing function is performed by the upconverter 918. Though not shown, the common input path 910 may further include a filter in certain aspects.

The output signal of the upconverter 918 may be the common input signal to each of the signal processing paths 920a-920d. Therefore, the upconverter 918 may be coupled to each of the signal processing paths 920a-920d (e.g., via the attenuators 922a-922d and/or phase shifters 924a-924d). For example, the common input signal may be split into multiple paths (e.g., using Wilkinson splitters), each path corresponding to one of the signal processing paths 920a-920d.

Accordingly, a single DPD is applied by the single DPD processing circuit 913 as part of generating a common input signal that is then split to each of the signal processing paths 920a-920d. The common input signal may be attenuated/amplified and phase shifted differently by each of the attenuators 922a-922d/variable gain amplifiers 925a-925d and phase shifters 924a-924d. Therefore, the input signal to each of the PAs 926a-926d may be of a different power. In order to operate each of the PAs 926a-926d at the same compression point, even with input signals at different powers, the signal, as in collector voltage ($V_{CC}$) and/or PA bias (e.g., PA gate bias voltage, PA base bias voltage, or PA bias current), applied to each PA 926a-926d may be varied (e.g., based on the attenuated/amplified and phase shifted signal being input to the PA 926a-926d), such that each of the PAs run at about the same compression point. Accordingly, the $V_{CC}$ and/or PA bias to each of the PAs 926a-926d may be separately controlled, and the values of the $V_{CC}$ and/or PA bias applied to each respective PA 926a-926d may be based on (e.g., a function of) the power of the input signal (or what the power of the input signal is expected to be) to each respective PA 926a-926d. Therefore, each of the PAs 926a-926d have approximately the same non-linear expansion behavior that can be compensated for by applying the same DPD.

Since the output signal from each PA has approximately the same non-linear expansion behavior, a single feedback path 970 from the output signal of only one of the PAs 926a-926d can be used as a feedback to the single DPD processing circuit 913 to calibrate the DPD function applied by the DPD processing circuit 913 to get a more linear response for the original input signal generated by the signal generator 912.

As shown, the transmit architecture 900 includes a single feedback path 970 coupled from the output of PA 926d (though the output of any PA 926 could be used) to the DPD processing circuit 913. In particular, the feedback path 970 includes a downconverter 972, an analog-to-digital converter (ADC) 974, and a calibration circuit 968. The downconverter 972 is shown as coupled to the output of the PA 926d. The downconverter 972 is configured to receive as input and downconvert the output signal of the PA 926d to a lower band of frequencies. The downconverter 972 is further coupled to the ADC 974, which is configured to receive the downconverted signal as input from the downconverter 972 and convert the analog signal to a digital signal. The ADC 974 is further coupled to a calibration circuit 968. The calibration circuit 968 may, for example, compare the received digital signal representative of the output signal of the PA 926d to the input signal processed by the DPD processing circuit 913 to generate the output signal at the PA 926d. The calibration circuit 968 may adjust the DPD function applied by the DPD processing circuit 913 based on any error detected by the calibration circuit 968 between the digital signal representative of the output signal of the PA 926d and the expected output of the PA 926d (based on the input signal from the signal generator 912) so as to achieve a more linear response from the PAs 926a-926d with respect to the original input signal generated by the signal generator 912.

Figure 9B:
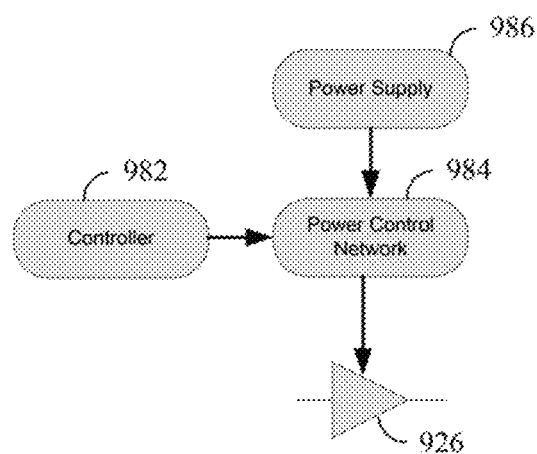
FIG. 9B illustrates a block diagram of a portion of an example transmit architecture for implementing DPD.

In order to control the $V_{CC}$ and/or PA bias applied to each PA 926a-926d individually, each PA 926a-926d may have associated with it, its own power control network 984 as shown in FIG. 9B. As shown, the PA 926 (corresponding to any one of PA 926a-926d), is associated with its own power control network 984.

The power control network 984 may comprise a voltage ladder, switching regulator, or any other suitable element capable of adjusting the voltage/current of a power supply. For example, where the $V_{CC}$, PA gate bias voltage, and/or PA base bias voltage applied to a PA 926 are adjusted, the power control network 984 may adjust the voltage of the power supply. Where the PA bias current applied to a PA 926 is adjusted, the power control network 984 may adjust the current of the power supply. The power control network 984 may be coupled to and configured to receive power (e.g., having a particular voltage/current) from a power supply 986 (e.g., battery, switched-mode power supply, linear regulator, etc.). In certain aspects, there may be a single power supply for all of the power control networks 984 associated with each of the different PAs 926a-926d. In certain aspects, there may be multiple power supplies for the power control networks 984 (e.g., one for each PA). It should be noted that in some aspects, the power supply 986 and one or more power control networks 984 may be composed of separate coupled components (e.g., integrated circuits, chips, etc.) or may be composed of a single component. Further, in some aspects, the power supply 986 (as a single power supply or multiple power supplies) may be configured to supply multiple power lines or traces (e.g., at different power levels or the same power level (e.g., voltages/currents)) to the power control network 984. In such aspects, the power control network 984 may be configured to select from one or more of the multiple power lines or traces (e.g., via a mux, switches, etc.) to adjust the power supply to the PAs 926a-926d. For example, the power control network 984 may select one of the multiple power lines with the appropriate voltage/current, or may combine power lines to achieve the appropriate voltage/current.

Each power control network 984 may have as its input, a control signal based on an input to its associated PA 926. For example, a controller 982 (e.g., baseband processor, baseband generator 912, attenuator controller, DSP 320, processor, etc.) may be configured to direct the supply or processing of the common input signal along the common input path 910, and processing of the common input signal along signal processing paths 920a-920d. Therefore, the controller 982 may have information about any signal processing applied to the common input signal to generate the signal input to any PA 926. Based on this information, the controller 982 may be able to determine the expected power of the signal input to a given PA 926. For example, the controller 982 may know the waveform of the common input signal, and can calculate the waveform of the expected signal input to the given PA 926 based on known the processing to be applied to the common input signal. The controller 982 can then calculate the power of the expected signal input to the given PA 926 based on the waveform of the expected signal input to the given PA 926. The controller 982 may be coupled to the power control network 984 and send a control signal to the power control network 984 based on the expected power of the input signal at the associated PA 926.

For example, in one embodiment, the controller 982 may be the baseband processor (e.g., baseband generator 912) that generates the baseband signal that is input along the common input path 910. Further, the baseband processor may be configured to control or receive information about the DPD function applied by the common DPD processing circuit 913, the attenuation/amplification applied by the attenuator 922/variable gain amplifier 925 along each signal processing path 920, and the phase shift applied by each phase shifter 924 along each signal processing path 920. Accordingly, the baseband processor may calculate, based on such information, the expected power of the input signal at each of the PAs 926a-926d. The baseband processor, based on the expected power of the input signal for a given PA 926 may then generate a control signal to send to the power control network 984 associated with the given PA 926. In particular, the control signal may control the power control network 984 to supply power at a level to the given PA 926 that is based on the input signal to the given PA 926 as discussed herein.

Based on the control signal, the power control network 984 may determine (e.g., select, adjust, etc.) a $V_{CC}$ and/or PA bias (e.g., PA gate bias voltage, PA base bias voltage, or PA bias current) to apply to the PA 926 such that each of the PAs 926 operate at the same compression point. For example, the power control network 984 may select a $V_{CC}$ and/or PA bias to apply to the associated PA 926 from a finite set of voltages/currents that correspond to a finite set of available attenuation levels for the input signal, in an analog fashion across a particular range of values, etc. based on the control signal.

Alternatively, in other aspects, the controller 982 may have as an input the signal at the input of each PA 926 and determine a $V_{CC}$ and/or PA bias to apply to the PA 926 based on that signal. Accordingly, in certain aspects, each of the power control networks 984 may ensure each of the PAs 926 operate at approximately the same compression point and have approximately the same non-linear expansion behavior that can be compensated for by applying the same DPD. In some aspects, a separate controller 982 may be provided for control of each power control network 984.

In some aspects, the controller 982 may comprise an attenuator controller configured to control a level of attenuation by the attenuator 922 as shown in FIG. 9. In some aspects, each attenuator 922 is controlled by its own controller 982. In some aspects, a single attenuator controller 982 individually controls each of the attenuators 922. The controller 982 may be coupled to the power control network 984 and send a control signal to the power control network 984 based on the amount of attenuation to be applied by the attenuator 922 to the signal on the signal processing path 920 associated with the PA 926 associated with the power control network 984.

In some aspects, the controller 982 may comprise a variable gain amplifier controller configured to control a level of amplification by a variable gain amplifier 925 as shown in FIG. 9A. In some aspects, each variable gain amplifier 925 is controlled by its own controller 982. In some aspects, a single variable gain amplifier controller 982 individually controls each of the variable gain amplifiers 925. The controller 982 may be coupled to the power control network 984 and send a control signal to the power control network 984 based on the amount of amplification to be applied by the variable gain amplifier 925 to the signal on the signal processing path 920 associated with the PA 926 associated with the power control network 984.

It should be noted that, in some aspects, multiple PAs 926a-926d may be associated with a single power control network 984 (e.g., for PAs 926a-926d with symmetric antennas). However, at least some of the PAs 926a-926d may have different attenuation from one another, and therefore different associated power control networks 984.

In certain aspects, the power control network 984 may be on the same chip as the transmit architecture 900 (e.g., implemented as a register that controls voltage). In certain aspects, the power control network 984 may not be on the same chip as the transmit architecture 900.

Accordingly, based on the systems and techniques described herein, a multi-antenna transmit architecture can be driven with only a single DPD processing circuit and feedback path required, therefore significantly reducing the complexity and die area required to implement the overall architecture.

Figure 10:
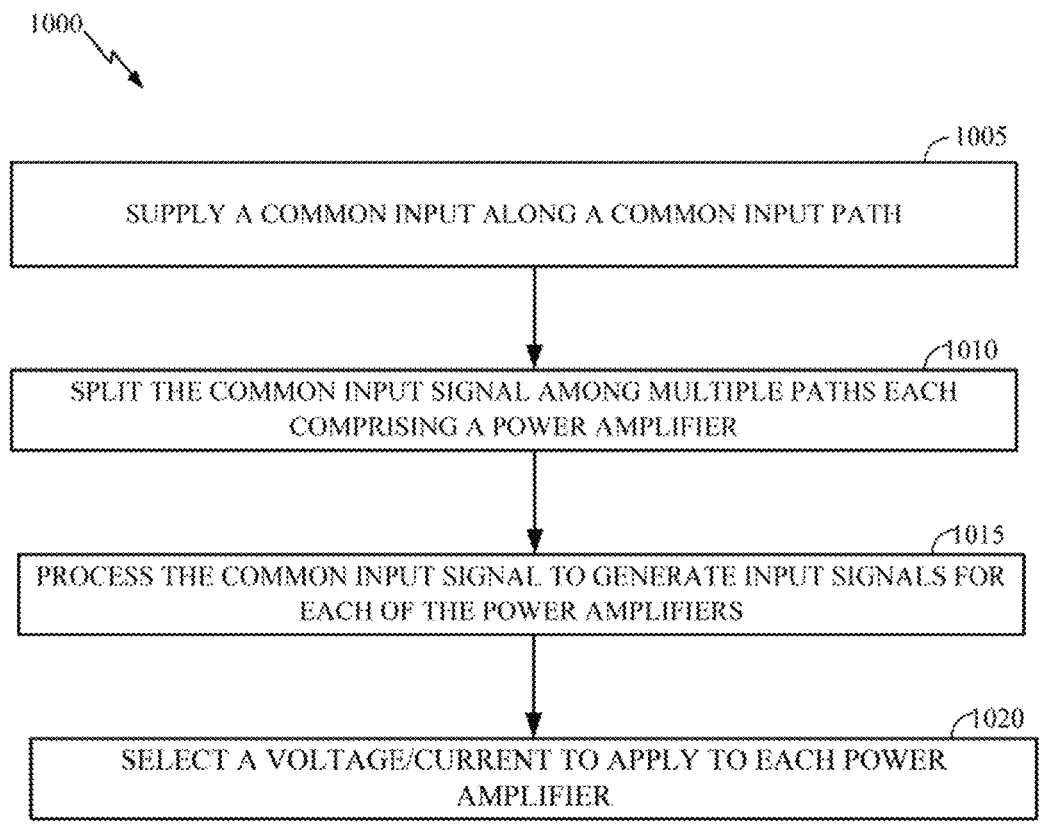
FIG. 10 illustrates example operations for power control of an amplifier, in accordance with certain aspects of the present disclosure.

FIG. 10 illustrates example operations for power amplifier control, in accordance with certain aspects of the present disclosure. At 1005, a common input signal is supplied along a common input path. For example, the common input signal may be supplied by a baseband processor and/or DPD processing circuit. At 1010, the common input signal is split among multiple signal processing paths. Each of the signal processing paths includes a separate PA.

At 1015, the common input signal received along each signal processing path is separately processed (e.g., attenuated/amplified, phase shifted, etc.) by each signal processing path. Accordingly, a different input signal may be generated for each PA of each signal processing path.

Further, at 1020, each of a plurality of power control networks selects a voltage/current (e.g., $V_{CC}$, PA gate bias voltage, PA base bias voltage, or PA bias current) to apply to the PA(s) associated with the particular power control network. The voltage/current may be selected based on a control signal generated based on the expected or actual power supply to the PA(s) associated with the particular power control network. For example, each of a plurality of power control networks may select the voltage/current so that each of the PAs operate at approximately the same compression point and have approximately the same non-linear expansion behavior that can be compensated for by applying the same DPD.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

Moreover, the term "or" is intended to mean an inclusive "or" rather than an exclusive "or." That is, unless specified otherwise, or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. A phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A power amplifier network comprising:
a first path comprising a first power amplifier;
a second path comprising a second power amplifier;
a common input path to both the first path and the second path, wherein the common input path comprises a common pre-distortion processing circuit;
a first power control network for controlling a first signal applied to the first power amplifier; and
a second power control network for controlling a second signal applied to the second power amplifier, wherein:
the first power control network is different from the second power control network;
the first power control network is configured to receive a control signal representative of an input power to the first power amplifier;
the second power control network is configured to receive a control signal representative of an input power to the second power amplifier, wherein the input power to the second power amplifier is different from the input power to the first power amplifier; and
the first power control network is configured to control an operating point of the first power amplifier and the second power control network is configured to control an operating point of the second power amplifier.

2. The power amplifier network of claim 1, further comprising a single feedback path from an output of the first power amplifier to the pre-distortion processing circuit.

3. The power amplifier network of claim 2, wherein the pre-distortion processing circuit is configured to adjust a signal along the common input path based on the output of the first power amplifier.

4. The power amplifier network of claim 1, wherein the operating point of the first power amplifier and the operating point of the second power amplifier are selected so that the first power amplifier and the second power amplifier operate at approximately a same compression point.

5. The power amplifier network of claim 1, wherein the first path further comprises a first variable gain amplifier and a first phase shifter, and wherein the second path further comprises a second variable gain amplifier and a second phase shifter.

6. The power amplifier network of claim 1, further comprising a third path comprising a third power amplifier, wherein the common input path is further common to the third path.

7. The power amplifier network of claim 6, wherein the first power control network is further configured for applying the first signal to the third power amplifier.

8. The power amplifier network of claim 7, wherein the first path and the third path comprise symmetric antennas.

9. The power amplifier network of claim 1, wherein the first signal comprises a collector voltage of the first power amplifier.

10. The power amplifier network of claim 1, wherein the first signal comprises at least one of a gate bias voltage, a base bias voltage, and a bias current of the first power amplifier.

11. The power amplifier network of claim 1, wherein the pre-distortion processing circuit comprises a digital pre-distortion (DPD) block.

12. The power amplifier network of claim 1, where in the second path further comprises:
an attenuator coupled to an input of the second power amplifier for attenuating an output from the common input path.

13. The power amplifier network of claim 1, further comprising:
a first antenna; and
a second antenna,
wherein an output of the first power amplifier is coupled to the first antenna and an output of the second power amplifier is coupled to the second antenna.

14. A method for controlling a plurality of power amplifiers, the method comprising:
supplying a common pre-distorted input signal along a common input path;
splitting the common pre-distorted input signal among a first path comprising a first power amplifier and a second path comprising a second power amplifier;
processing the common pre-distorted input signal to generate a first input signal to the first power amplifier;
processing the common pre-distorted input signal to generate a second input signal to the second power amplifier, wherein a power of the second input signal is different than a power of the first input signal; and
controlling an operating point at the first power amplifier and controlling an operating point at the second power amplifier, wherein the controlling comprises:
varying a first signal to apply to the first power amplifier based, at least in part, on the first input signal to the first power amplifier; and
varying a second signal to apply to the second power amplifier based, at least in part, on the second input signal to the second power amplifier.

15. The method of claim 14, further comprising adjusting the common pre-distorted input signal based on feedback from a single feedback path from an output of the first power amplifier.

16. The method of claim 14, wherein the first signal and the second signal are selected so that the first power amplifier and the second power amplifier operate at approximately a same compression point.

17. The method of claim 14, wherein processing the common pre-distorted input signal to generate a first input signal to the first power amplifier comprises at least one of amplifying, attenuating, and phase shifting the common input signal to generate the first input signal.

18. The method of claim 14, further comprising:
splitting the common pre-distorted input signal along a third path comprising a third power amplifier; and
selecting the first signal to apply to the third power amplifier.

19. The method of claim 14, wherein the first signal comprises a collector voltage of the first power amplifier.

20. The method of claim 14, wherein the first signal comprises at least one of a gate bias voltage, a base bias voltage, and a bias current of the first power amplifier.

21. The method of claim 14, wherein one of varying the first signal to apply to the first power amplifier or varying the second signal to apply to the second power amplifier comprises:
- selecting one of the first or second signal from a finite set of voltages or currents that corresponds to a finite set of attenuation levels for the first and the second input signals.

* * * * *